United States Patent
Ohkubo

[11] Patent Number: 5,824,151
[45] Date of Patent: Oct. 20, 1998

[54] VAPOR DEPOSITION METHOD

[75] Inventor: Nobuhiro Ohkubo, Ikoma, Japan

[73] Assignee: Sharp Kabushiki Kaisha, Osaka, Japan

[21] Appl. No.: 861,034

[22] Filed: May 21, 1997

[30] Foreign Application Priority Data

May 23, 1996 [JP] Japan ................................. 8-128829

[51] Int. Cl.[6] ............................. C30B 23/00; C30B 25/00
[52] U.S. Cl. ................................ 117/89; 117/88; 117/92; 117/953; 117/105; 117/954; 117/84; 438/442; 438/680
[58] Field of Search ........................ 117/953, 954, 117/92, 89, 88, 105, 84, 107, 939; 438/442, 680

[56] References Cited

U.S. PATENT DOCUMENTS

| | | | |
|---|---|---|---|
| 4,190,470 | 2/1980 | Walline | 117/954 |
| 5,036,022 | 7/1991 | Kvech | 117/954 |
| 5,168,077 | 12/1992 | Ashizawa | 117/954 |

FOREIGN PATENT DOCUMENTS 60-21518  2/1985  Japan .

Primary Examiner—Robert Kunemund
Assistant Examiner—Evelyn A. Defilló
Attorney, Agent, or Firm—Nixon & Vanderhye P.C.

[57] ABSTRACT

The method of forming a III-V group compound semiconductor crystalline layer on a semiconductor crystal containing at least V-group compound, includes the steps of: performing the crystal growth of the III-V compound semiconductor crystalline layer; and supplying an n-type dopant and a material compound containing a V-group element onto the semiconductor crystal without causing the crystal growth of the III-V compound semiconductor crystalline layer.

8 Claims, 8 Drawing Sheets

VAPOR DEPOSITION METHOD

BACKGROUND OF THE INVENTION

1. Field of the Invention:

The present invention relates to a vapor deposition method for growing a III-V group compound semiconductor used for a semiconductor laser, a light emitting diode (LED), etc. and a vapor deposition apparatus used for growing a III-V group compound semiconductor.

2. Description of the Related Art:

As a method for growing a III-V group compound semiconductor, a vapor deposition method using organic metal is known. The vapor deposition method is most promising due to its outstanding mass-productivity and ability to grow a very thin crystal film.

The following three typical methods are known as the vapor deposition method: metal organic chemical vapor deposition (MOCVD), metal organic molecular beam epitaxy (MOMBE), and chemical beam epitaxy (CBE).

According to the above-mentioned methods, a V-group element material is supplied onto a crystal surface, while a crystal substrate is increased or decreased in temperature and while growth is suspended, for the purpose of preventing a V-group element, arsenic (As) from being thermally lost from the crystal surface. Then, a III-group element material and a V-group element material are simultaneously supplied onto the crystal surface. Thus, a III-V group compound semiconductor is grown.

Hereinafter, the case where a III-V group compound semiconductor is vapor-deposited by an MOCVD method will be exemplified.

In the case of growing GaAs, a metal organic compound, triethylgallium (TEGa) or trimethylgallium (TMGa), containing a III-group element, and arsine ($AsH_3$) containing a V-group element are used as materials. While a crystal substrate is increased or decreased in temperature and while growth is suspended, $AsH_3$ is supplied into a vapor deposition chamber of a vapor deposition apparatus for preventing As from being lost from a crystal surface. Then, TEGa or TMGa and $AsH_3$ are supplied into the vapor deposition chamber to grow a GaAs layer.

In another case, AlGaAs is grown. In this case, TEGa or TMGa which is a metal organic compound containing a III-group element; triethylaluminum (TEAl) or trimethylalluminum (TMAl) which is also a metal organic compound containing a III-group element; and $AsH_3$ containing a V-group element are used as materials. While a crystal substrate is increased or decreased in temperature and while growth is suspended, $AsH_3$ is supplied into a vapor deposition chamber of a vapor deposition apparatus in order to prevent As from being lost from a crystal surface. Then, TEGa or TMGa, TEAl or TMAl, and $AsH_3$ are supplied into the vapor deposition chamber for growing AlGaAs.

The above-mentioned metal organic compounds generally have extremely strong reactivity with respect to oxygen and water ($H_2O$). Therefore, even when the atmosphere inside the vapor deposition chamber is an inert gas, such as hydrogen and nitrogen, a trace amount of oxygen and moisture remaining in the vapor deposition chamber reacts with a metal organic compound to form fine powders made of an oxide of Ga, Al, etc., thereby preventing the quality of the vapor-deposited film and the interface thereof from improving. Oxygen and moisture which have not reacted with an metal organic compound are introduced into the vapor-deposited film and the interface thereof as impurities, thus adversely affecting crystal characteristics, e.g., electrical and optical characteristics and the like, which reflect the imperfection of crystal and the quality thereof.

Furthermore, it is impossible to completely prevent the impurities such as oxygen and moisture from being introduced into a substrate on delivery. It is also impossible to completely prevent the inside of a vapor deposition chamber from being contaminated by loss of oxygen, moisture, etc. from a substrate surface due to heating of the substrate.

As described above, it was difficult to obtain a good quality vapor-deposited film and interface thereof by any of the above-mentioned conventional vapor deposition methods.

In order to improve the quality of a grown film, a method for gettering oxygen in a vapor deposition chamber by supplying a material gas with a trace amount of Al added thereto into the vapor deposition chamber during growth is proposed in Japanese Laid-Open Patent Publication No. 60-21518. However, this method cannot be used for growing a film containing Al because it is difficult to adjust the components of the film. This technique cannot be used even when growth is suspended for the following reason: when growth is suspended, a V-group compound is supplied; therefore, when Al is supplied, an AlAs film is grown.

SUMMARY OF THE INVENTION

According to one aspect of the invention, a method of forming a III-V group compound semiconductor crystalline layer on a semiconductor crystal containing at least V-group compound, is provided. The method includes the steps of: performing the crystal growth of the III-V compound semiconductor crystalline layer; and supplying an n-type dopant and a material compound containing a V-group element onto the semiconductor crystal without causing the crystal growth of the III-V compound semiconductor crystalline layer.

In one embodiment of the invention, the n-type dopant and the material compound containing the V-group element are supplied during a period in which a temperature of the semiconductor crystal is adjusted.

In another embodiment of the invention, the n-type dopant and the material compound containing the V-group element are supplied during a period from the beginning of the heating of the semiconductor crystal to the beginning of the crystal growth of the III-V group compound semiconductor crystalline layer.

In still another embodiment of the invention, the n-type dopant and the material compound containing the V-group element are supplied during a period in which the crystal growth of the III-V group compound semiconductor crystalline layer is suspended.

In still another embodiment of the invention, the n-type dopant and the material compound containing the V-group element are supplied during at least two of a period in which a temperature of the semiconductor crystal is adjusted; a period from the beginning of the heating of the semiconductor crystal to the beginning of the crystal growth of the III-V group compound semiconductor crystalline layer; and a period in which the crystal growth of the III-V group compound semiconductor crystalline layer is suspended.

In still another embodiment of the invention, the method further includes the step of supplying another material compound containing III-group element together with the n-type dopant and the material compound containing the V-group element.

In still another embodiment of the invention, silane is used as the n-type dopant. Alternatively, disilane may be used as the n-type dopant.

According to another aspect of the invention, a vapor deposition apparatus is provided. The vapor deposition apparatus includes: a vapor deposition chamber; and a plurality of lines connected to the vapor deposition chamber, wherein at least one line is provided independently of the other line and is used for supplying an n-type dopant to the vapor deposition chamber.

Hereinafter, the function of the present invention will be described.

According to the present invention, prior to vapor deposition, at least an n-type dopant and a material compound containing a V-group element are supplied together onto a crystal substrate. This prevents As from being lost from the crystal substrate and allows oxygen and moisture remaining in a vapor deposition chamber to be gettered. More specifically, a trace amount of oxygen and moisture remaining in the vapor deposition chamber reacts with the n-type dopant so as to be evacuated outside a vapor deposition apparatus.

Moreover, by supplying the n-type dopant; the material compound containing a V-group element; and a material compound containing a III-group element during the vapor deposition, oxygen and moisture contained in gas of the material compounds which are supplied for the vapor deposition to the vapor deposition chamber are also gettered to be evacuated outside the vapor deposition apparatus. As a result, the concentration of oxygen and moisture remaining in the vapor deposition chamber decreases. Therefore, during the vapor deposition, fine powders of an oxide are not formed on a vapor-deposited film and an interface thereof, so that crystal defects are not caused on the surface of the crystal substrate. Thus, a III-V group compound semiconductor layer can be grown with good crystallinity.

The n-type dopant and the material compound containing the V-group element are supplied together in any of the following first, second, and third periods. In the first period, the temperature of a crystal substrate on which a III-V group compound semiconductor layer is formed is adjusted to a predetermined temperature. The second period refers to a period from the beginning of heating of the crystal substrate on which a III-V group compound semiconductor layer is formed until the beginning of crystal growth. After the beginning of crystal growth, the material compound containing a V-group element, a material compound containing a III-group element, and the n-type dopant are supplied onto the crystal surface, whereby a III-V group compound semiconductor layer is grown. During the third period, crystal growth is suspended. After crystal growth is suspended, a material compound containing a V-group element and a material compound containing a III-group element are supplied onto the crystal surface, whereby a III-V group compound semiconductor layer is grown. In the case where a plurality of III-V group compound semiconductor layers are grown, the aforementioned three periods for the respective semiconductor layer are appropriately combined with the three periods for other layers.

Thus, the invention described herein makes possible the advantages of (1) providing a vapor deposition method allowing a good quality vapor-deposited film and interface thereof to be obtained; and (2) providing a vapor deposition apparatus using the method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative embodiments with reference to the drawings.

Embodiment 1

In Embodiment 1, an MOCVD method is used, and a silane ($SiH_4$) gas is utilized as an n-type dopant while a substrate temperature is increased or decreased.

Figure 1:
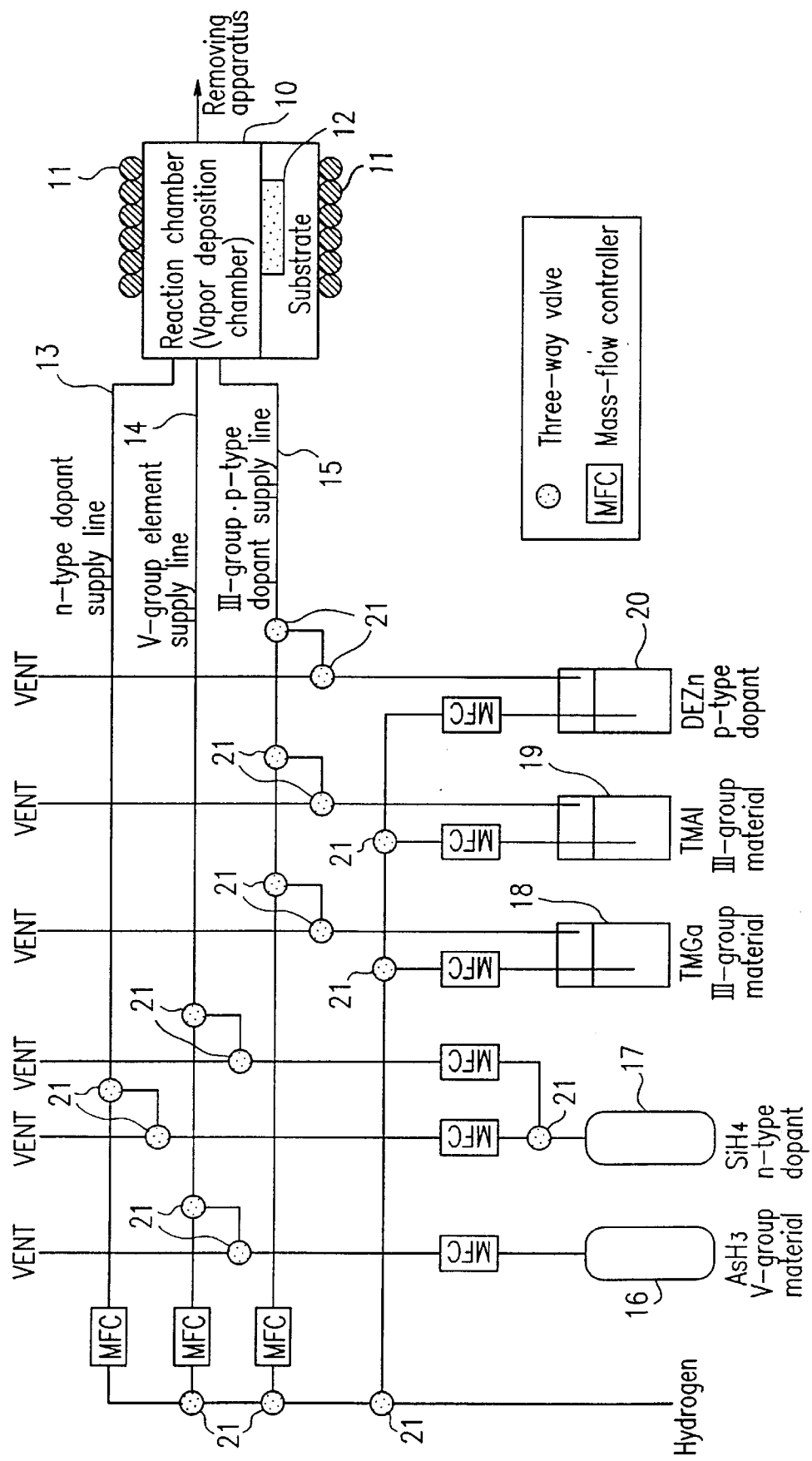
FIG. 1 is a schematic diagram showing a structure of a vapor deposition apparatus.

In the present embodiment, a reduced-pressure horizontal radio-frequency heating furnace as shown in FIG. 1 is used as a vapor deposition apparatus. The reduced-pressure horizontal radio-frequency heating furnace has a reaction chamber (vapor deposition chamber) 10. RF coils 11 for heating are provided outside the reaction chamber 10. A substrate 12 is provided in the reaction chamber 10. An n-type dopant stored in an n-type dopant storage tank 17 is supplied into the reaction chamber 10 via an n-type dopant supply line 13, and a material compound containing a V-group element (($AsH_3$) in this embodiment) stored in a V-group element storage tank 16 is supplied into the reaction chamber 10 via a V-group element supply line 14.

Moreover, at least one of material compounds containing III-group elements stored in III-group element storage tanks 18 and 19 and a p-type dopant stored in a p-type dopant storage tank 20 is selectively supplied into the reaction chamber 10. In this embodiment, TMGa is stored in the III-group element storage tank 18, TMAl is stored in the III-group storage tank 19, and diethylzinc (DEZn) is stored in the p-type dopant storage tank 20. The supply of the material from each of the tanks 16 to 20 is appropriately selected by switching three-way valves 21, depending upon the kind of a III-V group compound semiconductor crystal to be grown. The supply amount is adjusted by mass-flow controllers MFC. Furthermore, hydrogen is supplied to each of the lines 13 to 15 and each of the tanks 16 to 20 via the three-way valves 21.

As shown in FIG. 1, the n-type dopant supply line 13, which is used only while crystal growth is suspended, is provided independently of other lines. This is because the supply amount of the n-type dopant is prevented from being affected by the supply amount of another material gas. In this embodiment, one n-type dopant supply line is provided. However, two or more n-type dopant supply lines may be provided.

In the present embodiment, a GaAs thin film was grown on a GaAs substrate by the above-mentioned vapor deposition apparatus. TMGa, $ASH_3$ diluted to 10% with $H_2$, and $SiH_4$ diluted to 100 ppm with $H_2$ were used as materials.

First, the pressure in the furnace was prescribed to be 76 Torr. The flow rate of $AsH_3$ was retained at $2.0 \times 10^{-3}$ mol/min until the beginning of crystal growth, i.e., for 10 minutes from the beginning of heating until the substrate temperature became stable. The total flow rate of the material gasses and carrier gas was set to be 9 liters/min. The flow rate of $SiH_4$ was changed from 0 to $4.5 \times 10^7$ mol/min while these conditions were retained constant.

After the substrate temperature became stable at 750° C., the flow rates of TMGa and $AsH_3$ were set to be $1.8 \times 10^{-5}$ mol/min and $2.0 \times 10^{-3}$ mol/min, respectively, and the total flow rate of the material gasses and carrier gas was set to be 9 liters/min. While these conditions were retained constant, a GaAs thin film was grown for 90 minutes with the flow rate of $SiH_4$ being set to be the same as described above. Thus, a GaAs thin film with a thickness of 2 pm was obtained.

Figure 2:
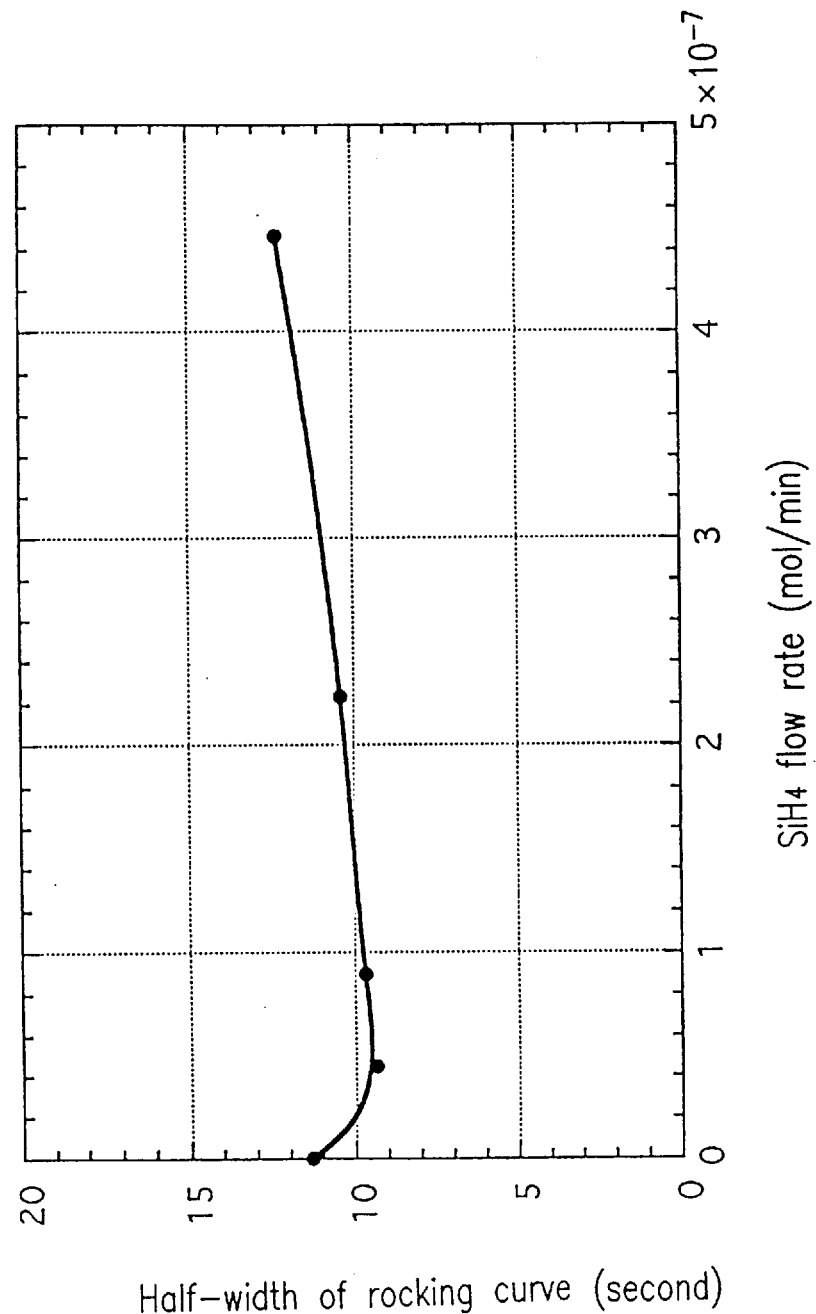
FIG. 2 is a graph showing a half-width of an X-ray rocking curve with respect to the flow rate of $SiH_4$ in a crystal layer obtained in Embodiment 1 of the present invention.

FIG. 2 shows a relationship between the flow rate of $SiH_4$ supplied together with $AsH_3$ during a period of time from the beginning of heating until the completion of growth and the crystallinity of an obtained growth layer (represented by a half-width of a double crystal X-ray diffraction rocking curve). In FIG. 2, the abscissa axis represents the flow rate of $SiH_4$ (mol/min) and the ordinate axis represents a half-width of a double crystal X-ray diffraction rocking curve (second).

As is understood from FIG. 2, when an appropriate amount of $SiH_4$ was supplied, the half-width of the double crystal X-ray diffraction rocking curve became small, and the crystallinity of the obtained grown layer was enhanced, compared with the case where $SiH_4$ was not supplied. The surface defect density after growth became 900/cm², 100/cm², and 70/cm², respectively, when the flow rate of $SiH_4$ was set to be 0, $4.5 \times 10^{-8}$ mol/min, and $9.0 \times 10^{-8}$ mol/min. Thus, the surface defect density was enhanced, compared with the case where an appropriate amount of $SiH_4$ was not supplied.

Embodiment 2

In Embodiment 2, film growth in Embodiment 1 is suspended in the middle of a process.

In the present embodiment, a GaAs film was grown on a GaAs substrate, and AlGaAs was grown on the GaAs film. TMGa, TMAl, $AsH_3$ diluted to 10% with $H_2$, and $SiH_4$ diluted to 100 ppm with $H_2$ were used as materials. The same vapor deposition apparatus as that in Embodiment 1 was used.

First, the pressure in the furnace was prescribed to be 76 Torr. The flow rates $AsH_3$ and $SiH_4$ were retained at $2.0 \times 10^{-3}$ mol/min and $9.0 \times 10^{-8}$ mol/min, respectively, and the total flow rate of the material gasses and carrier gas was retained at 9 liters/min until the beginning of crystal growth, i.e., for 10 minutes from the beginning of heating until the substrate temperature became stable. A substrate was heated while these conditions were retained constant.

After the substrate temperature became stable at 750° C., the flow rates of TMGa and $AsH_3$ were set to be $1.8 \times 10^{-5}$ mol/min and $2.0 \times 10^{-3}$ mol/min, respectively, and the total flow rate of the material gasses and carrier gas was set to be 9 liters/min. While these conditions were retained constant, a GaAs thin film was grown.

Thereafter, the crystal growth was suspended for 5 seconds. While the crystal growth was suspended, the flow rates of $AsH_3$ (10%) and $SiH_4$ were retained at $2.0 \times 10^{-3}$ mol/min and $9.0 \times 10^{-8}$ mol/min, and the total flow rate of the material gasses and carrier gas was retained at 9 liters/min. These conditions were retained constant.

Next, the flow rates of TMGa, TMAl, and $AsH_3$ (10%) were set to be $7.2 \times 10^{-5}$ mol/min, $1.06 \times 10^{-5}$ mol/min, and $2.0 \times 10^{-3}$ mol/min, respectively, and the total flow rate of the material gasses and carrier gas was set to be 9 liters/min. An AlGaAs thin film and a GaAs thin film were grown for 95 minutes while these conditions were retained constant. As a result, a GaAs thin film with a thickness of 1 μm and an AlGaAs thin film with a thickness of 1 μm were obtained.

Figure 3:
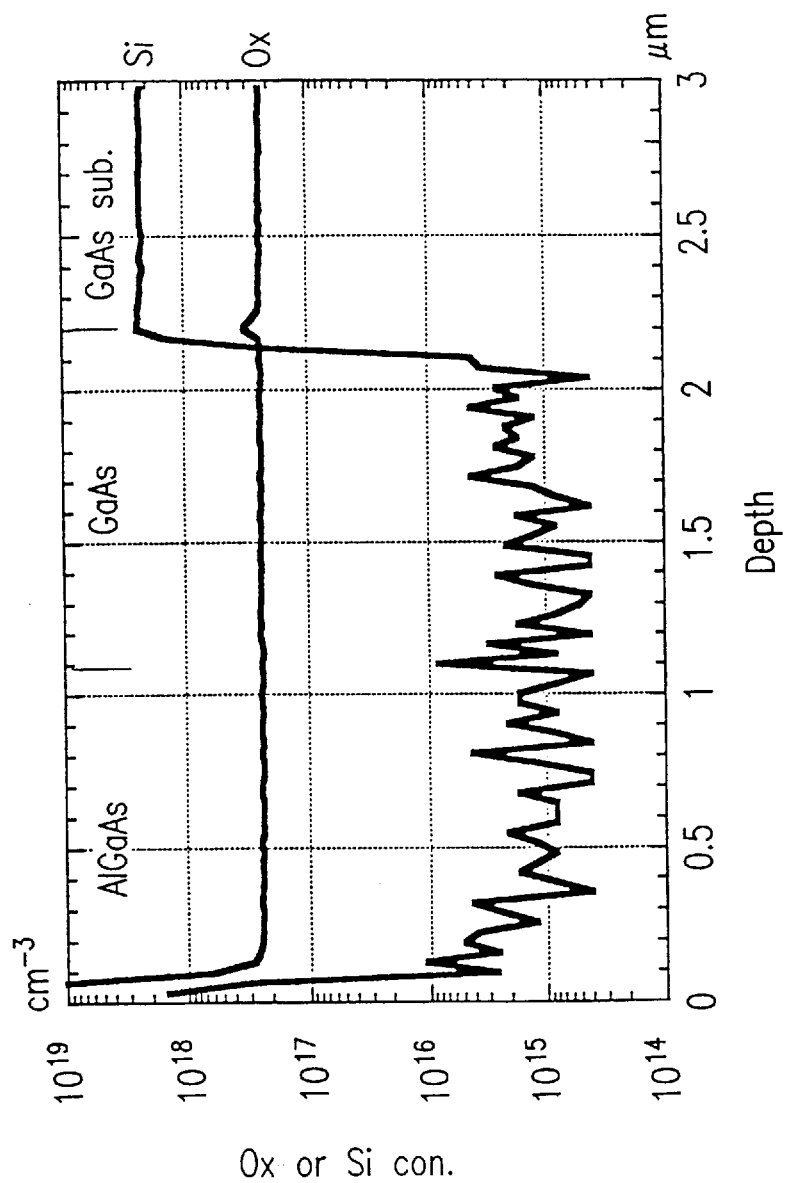
FIG. 3 shows results of impurity analysis of films grown in Embodiment 2 by a secondary ion mass spectrometer (SIMS).
Figure 4:
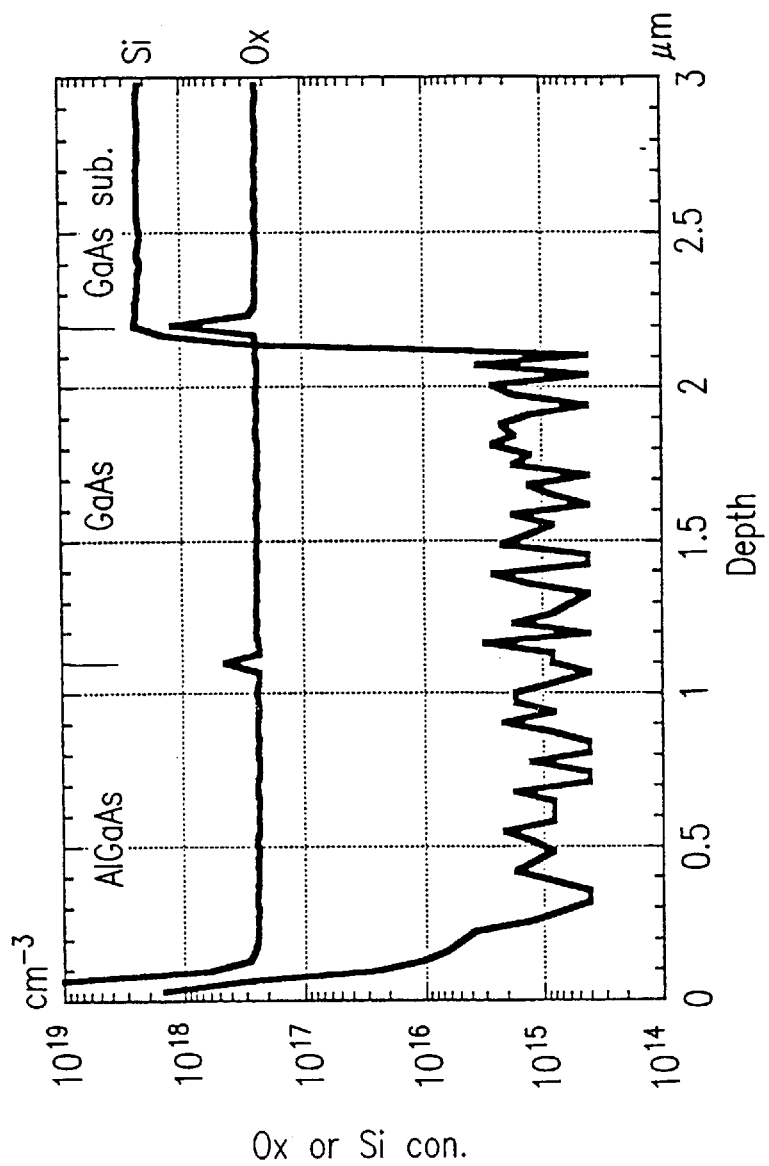
FIG. 4 shows results of impurity analysis of films grown in a comparative example of Embodiment 2 (or Embodiment 3) by an SIMS, in the case where $SiH_4$ (or $Si_2H_6$) is not supplied while a substrate temperature is increased and while growth is suspended.

FIG. 3 shows results of impurity analysis of the resultant films by a secondary ion mass spectrometer (SIMS). FIG. 4 shows results of impurity analysis of films grown in a comparative example of Embodiment 2 by an SIMS, in the case where the n-type dopant, which corresponds to $SiH_4$ in this embodiment, is not supplied while a substrate temperature is increased and while growth is suspended. In FIGS. 3 and 4, the abscissa axis represents the depth from the surface of the grown film (depth: μm) and the ordinate axis represents the impurity concentration (cm$^{-3}$).

It is apparent from FIGS. 3 and 4 that the impurity concentration of oxygen on the interface between the GaAs substrate and the GaAs film is smaller in the case of using $SiH_4$ than in the case of not using $SiH_4$. It is also apparent from these figures that the impurity concentration of oxygen on the interface between the GaAs film and the AlGaAs film is smaller in the case of using $SiH_4$ than in the case of not using $SiH_4$. Thus, it is understood that clean interfaces of films grown are obtained in the case of supplying $SiH_4$. Such films grown with good purity and growth interfaces can be obtained even when an ordinary growth apparatus is used.

Embodiment 3

Embodiment 3 is the same as Embodiment 2, except that disilane ($Si_2H_6$) is used as an n-type dopant in place of $SiH_4$.

In the present embodiment, a GaAs film was grown on a GaAs substrate, and AlGaAs was grown on the GaAs film. TMGa, TMAl, $AsH_3$ diluted to 10% with $H_2$, and $Si_2H_6$ diluted to 100 ppm with $H_2$ were used as materials. The same vapor deposition apparatus as that in Embodiment 1 was used.

First, the pressure in the furnace was prescribed to be 76 Torr. The flow rates of $AsH_3$ and $Si_2H_6$ were retained at $2.0 \times 10^{-3}$ mol/min and $9.0 \times 10^{-8}$ mol/min, respectively, and the total flow rate of the material gasses and carrier gas was retained at 9 liters/min until the beginning of crystal growth, i.e., for 10 minutes from the beginning of heating until the substrate temperature became stable. A substrate was heated while these conditions were retained constant.

After the substrate temperature became stable at 750° C., the flow rates of TMGa and $AsH_3$ were set to be $1.8 \times 10^{-5}$ mol/min and $2.0 \times 10^{-3}$ mol/min, respectively, and the total flow rate of the material gasses and carrier gas was set to be 9 liters/min. While these conditions were retained constant, a GaAs thin film was grown.

Thereafter, the crystal growth was suspended for 5 seconds. While the crystal growth was suspended, the flow rates of $AsH_3$ (10%) and $Si_2H_6$ were retained at $2.0 \times 10^{-3}$ mol/min and $9.0 \times 10^{-8}$ mol/min, respectively, and the total flow rate of the material gasses and carrier gas was retained at 9 liters/min. These conditions were retained constant.

Next, the flow rates of TMGa, TMAl, and $AsH_3$ (10%) were set to be $7.2 \times 10^{-6}$ mol/min, $1.0 \times 10^{-5}$ mol/min, and $2.0 \times 10^{-3}$ mol/min,. respectively, and the total flow rate of the material gasses and carrier gas was set to be 9 liters/min. An AlGaAs thin film and a GaAs thin film were grown for 95 minutes while these conditions were retained constant. As a result, a GaAs thin film with a thickness of 1 $\mu$m and an AlGaA thin film with a thickness of 1 $\mu$m were obtained.

Figure 5:
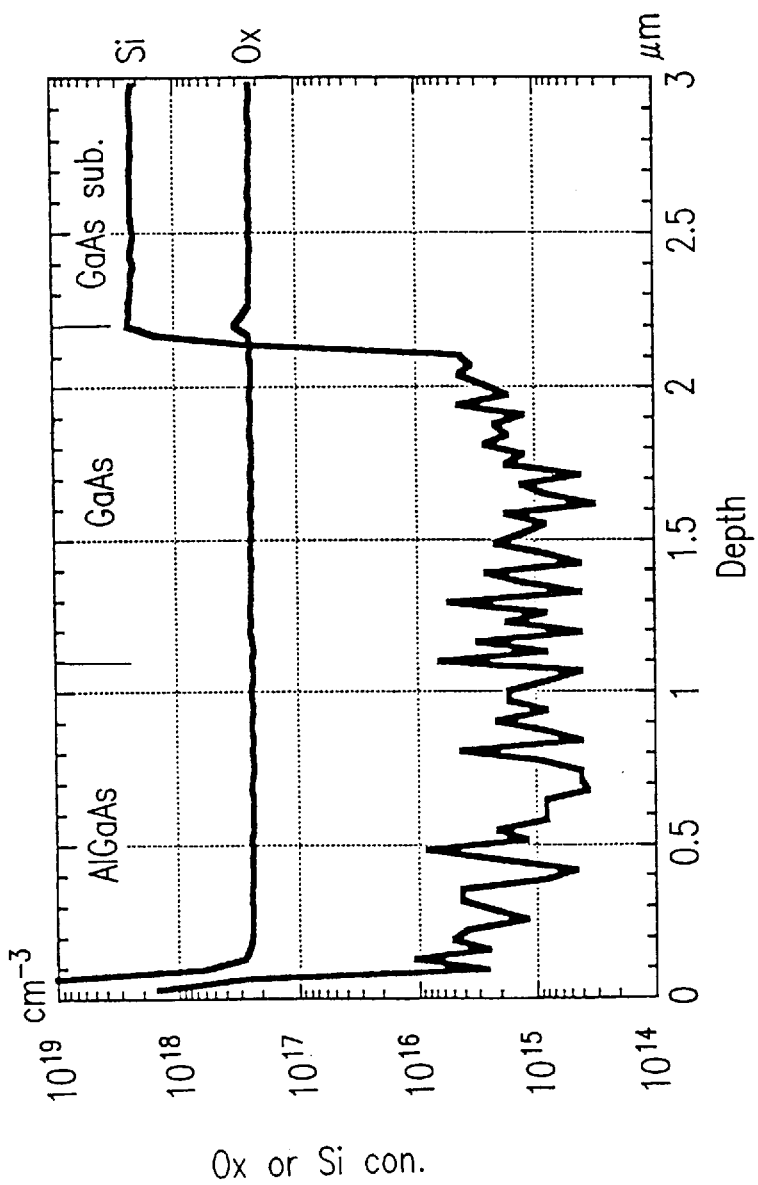
FIG. 5 shows results of impurity analysis of the resultant films grown in Embodiment 3 by an SIMS.

FIG. 5 shows results of impurity analysis of the resultant films by an SIMS FIG. 4 shows results of impurity analysis of films grown in a comparative example of Embodiment 3 by an SIMS, in the case where the n-type dopant, which correspond to $Si_2H_6$ in this embodiment, is not supplied while a substrate temperature is increased and while growth is suspended, as described before. In FIGS. 4 and 5, the abscissa axis represents the depth of the surface of the grown film (depth: $\mu$m) and the ordinate axis represents the impurity concentration ($cm^{-3}$).

It is apparent from FIGS. 4 and 5 that the impurity concentration of oxygen on the interface between the GaAs substrate and the GaA film is smaller in the case of using $Si_2H_6$ than in the case of not using $Si_2H_6$. It is also apparent from these figures that the impurity concentration of oxygen on the interface between the GaAs film and the AlGaAs film is smaller in the case of using $Si_2H_6$ than in the case of not using $Si_2H_6$. Thus, it is understood that clean inter aces of films grown are obtained in the case of supplying $Si_2H_6$. Such films grown with good purity and growth interfaces can be obtained even when an ordinary growth apparatus is used.

Embodiment 4

In Embodiment 4, an MOMBE method was used to grow a GaAs thin film on a GaAs substrate. TMGa, metallic As, and $SiH_4$ diluted to 100 ppm with $H_2$ were used as materials. An MOMBE apparatus was used as a vapor deposition apparatus.

First, metallic As and $SiH_4$ were supplied to a substrate until the beginning of crystal growth, i.e., for 10 minutes from the beginning of heating until the substrate temperature became stable.

After the substrate temperature became stable at 600° C., TMGa, metallic As, and $SiH_4$ were supplied to the substrate. Thus, a GaAs thin film was grown for 110 minutes to a thickness of 2 $\mu$m.

In the present embodiment, metallic As and $SiH_4$ were supplied together during a period of time from the beginning of heating until the completion of growth. The surface defect density after growth became 100/$cm^2$. In contrast, in the case where $SiH_4$ as an n-type dopant was not supplied under the same conditions as the above, the surface defect density after growth became 1000/$cm^2$. Thus, the surface defect density was smaller in the case of using $SiH_4$ than in the case of not using $SiH_4$.

Embodiment 5

In Embodiment 5, a CBE method was used to grow a GaAs thin film on a GaAs subs rate. TMGa, $AsH_3$ diluted to 10 with $H_2$, and $SiH_4$ diluted to 100 ppm with $H_2$ were used as materials. A CBE apparatus was used as a vapor deposition apparatus.

First, $AsH_3$ and $SiH_4$ wee supplied to a substrate until the beginning of crystal growth, i.e., for 10 minutes from the beginning of heating until the substrate temperature became stable.

After the substrate temperature became stable at 600° C., TMGa, $AsH_3$, and $SiH_4$ were supplied to the substrate. Thus, a GaAs thin fi m was grown to a thickness of 2 $\mu$m for 100 minutes.

In the present embodiment, $SiH_4$ was supplied together with $AsH_3$ during a period of time from the beginning of heating until the completion of growth. The surface defect density after growth became 200/$cm^2$. In contrast, in the case where $SiH_4$ was not supplied under the same conditions as the above, the surface defect density after growth became 800/$cm^2$. Thus, the surface defect density was smaller in he case of using $SiH_4$ than in the case of not using $SiH_4$.

Embodiment 6

The production of a semiconductor laser will be described.

Figure 6:
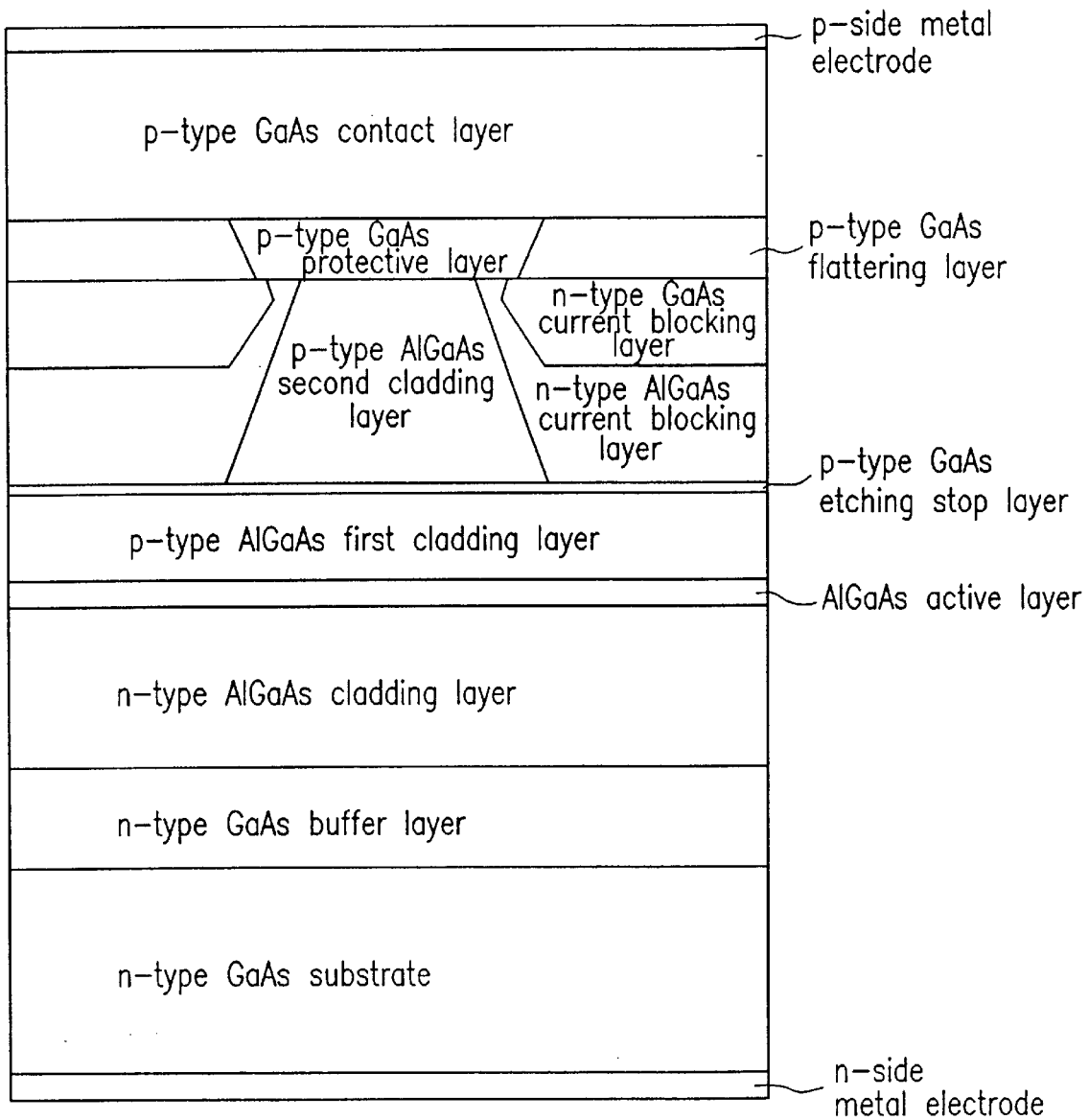
FIG. 6 shows a structure of a semiconductor laser obtained in Embodiment 6.

In the present embodiment, a semiconductor laser structure was formed on a GaAs substrate as shown in FIG. 6. The semiconductor laser includes an n-type GaAs buffer layer, an n-type AlGaAs cladding layer, an AlGaAs active layer, a p-type AlGaAs first cladding layer, a p-type GaAs etching stop layer, a p-type AlGaAs second cladding layer, and a p-type GaAs protective layer formed in this order on an n-type GaAs substrate. A stripe-shaped mesa structure is formed on the p-type GaAs etching stop layer. The mesa structure is buried with an n-type AlGaAs current blocking layer, an n-type GaAs current blocking layer, and p-type GaAs flattening layer on both sides. A p-type GaAs contact layer is formed on the p-type GaAs protective layer and the p-type GaAs flattening layer.

A p-side metal electrode and an n-side metal electrode are formed on the p-type GaAs contact layer and the n-type GaAs substrate, respectively. TMGa, TMAl, $AsH_3$ diluted to 10% with $H_2$, DEZn, $SiH_4$ diluted to 100 ppm with $H_2$, and $H_2$ are used as materials. The same vapor deposition apparatus as that in Embodiment 1 is used.

First, the pressure in the furnace was prescribed to be 76 Torr. The flow rates of $AsH_3$ and $SiH_4$ were retained at $2.0\times10^{-3}$ mol/min and $9.0\times10^{-8}$ mol/min, respectively, and the total flow rate of the material gasses and carrier gas was retailed at 9 liters/min until the beginning of crystal growth and during suspension of the crystal growth, i.e., for 10 minutes from the beginning of heating until the subs rate temperature became stable and for 5 seconds during which crystal growth was suspended. While these conditions were retained constant, crystal growth for forming the semiconductor laser structure as shown in FIG. 6 was performed. In this case, the period in which crystal is not grown includes at least two of the following periods: the period of adjusting the temperature of a crystal substrate on which the crystal growth is performed; the period from the beginning of heating of a crystal substrate to the beginning of crystal growth; and the period in which crystal growth is suspended.

Figure 7:
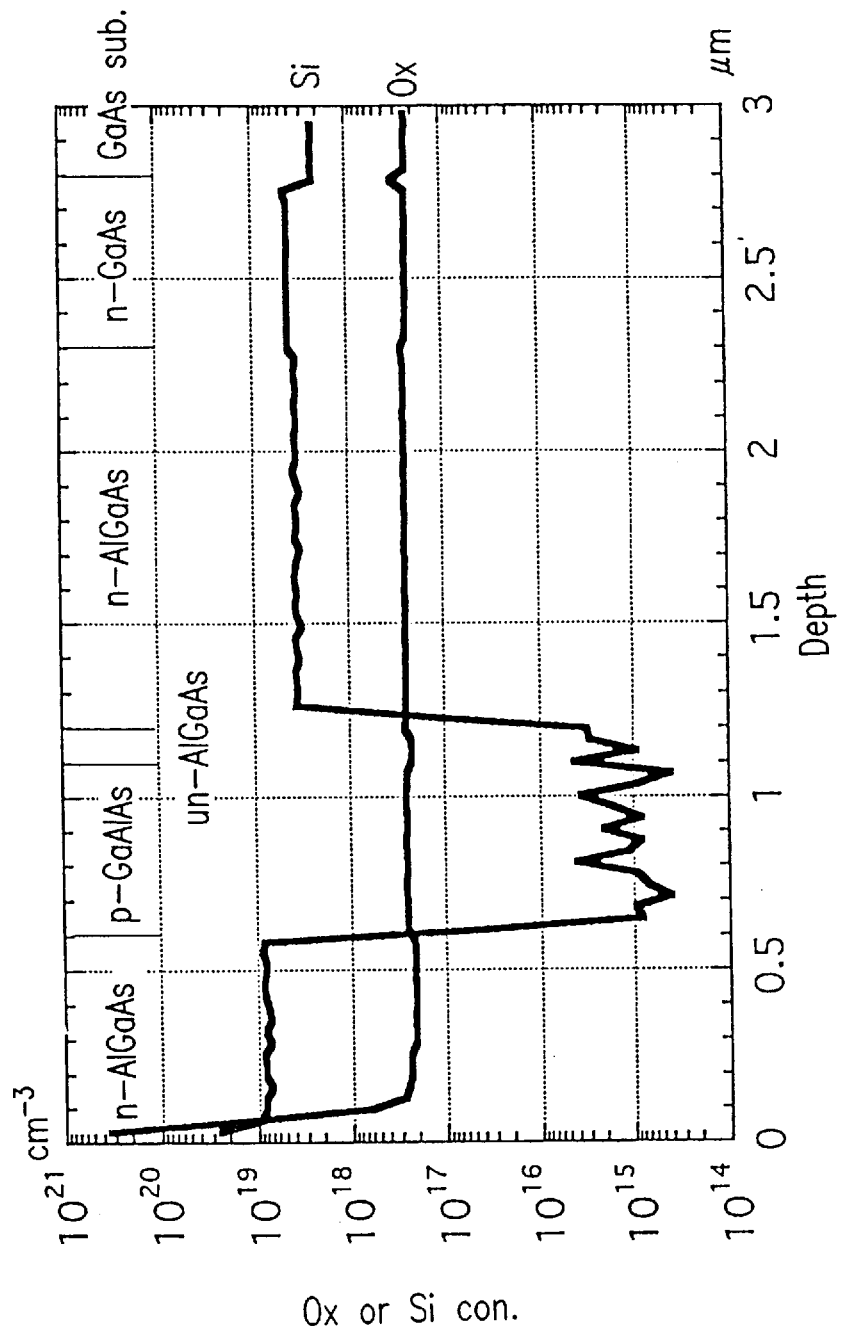
FIG. 7 shows results of impurity analysis of the current blocking portion of the resultant films grown in Embodiment 6 by an SIMS.
Figure 8:
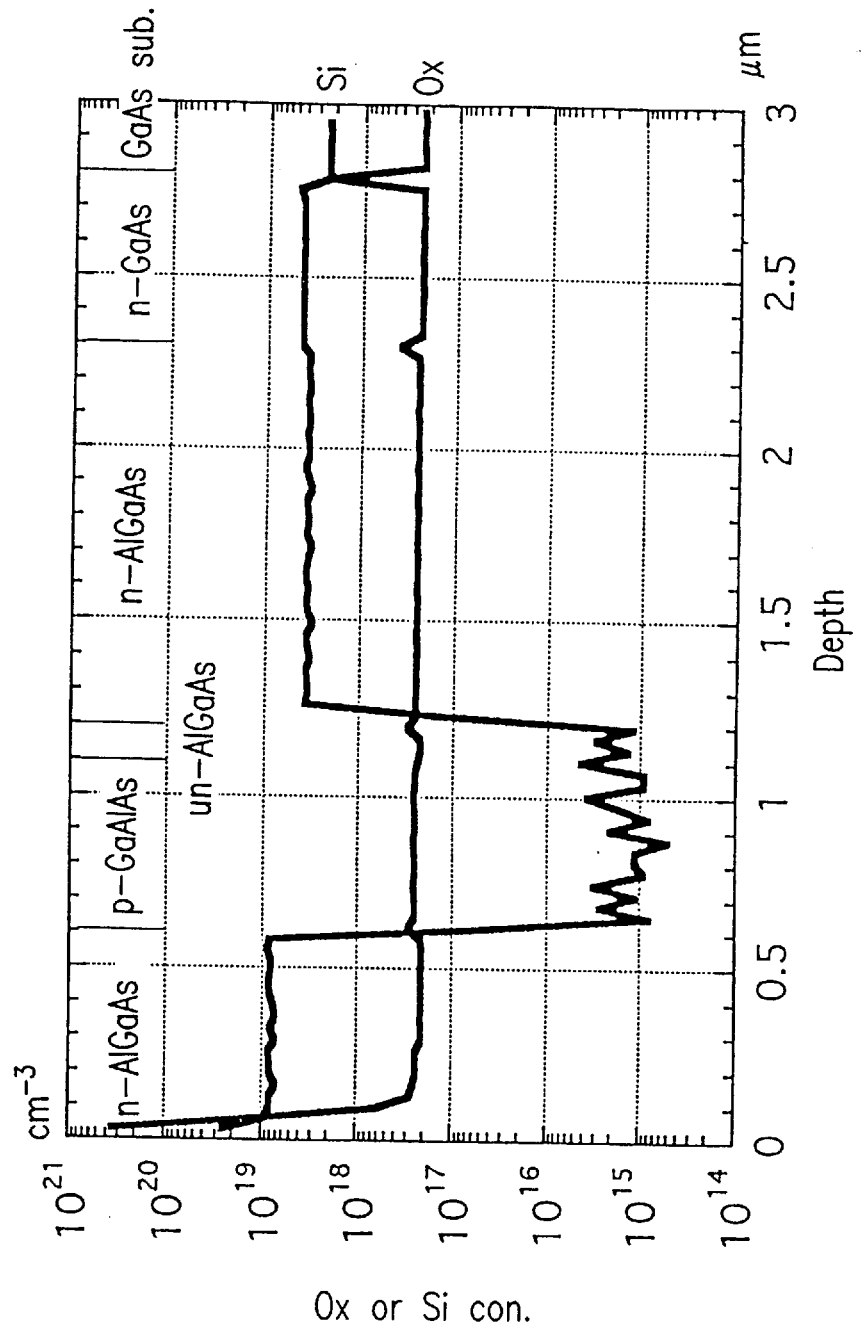
FIG. 8 shows results of impurity analysis of the current blocking portion of the films grown in a comparative example of Embodiment 6, in the case where $SiH_4$ is not supplied while a substrate temperature is increased and while growth is suspended.

FIG. 7 shows results of impurity analysis of the current blocking portion of the resultant film by an SIMS. FIG. 8 shows results impurity analysis of the current blocking portion of the resultant film in a comparative example of Embodiment 6, in the case where $SiH_4$ as an n-type dopant is not supplied while a substrate temperature is increased and while growth is suspended. In FIGS. 7 and 8, the abscissa axis represents the depth from the surface of the resultant film (depth: $\mu$m) and the ordinate axis represent the impurity concentration ($cm^-$).

It is apparent from FIGS. 7 and 8 that the impurity concentration of oxygen on the interface between the GaAs substrate and the n-type GaAs film is smaller in the case of using $SiH_4$ than in he case of not using $SiH_4$. It is also apparent from these figures that the impurity concentration of oxygen on the interfaces between each of the films grown is smaller in the case of using $SiH_4$ than in the case of not using $SiH_4$. Thus, it is understood that clean interfaces of films grown are obtained in the case of supplying $SiH_4$. Such films grown with good purity and growth interfaces can be obtained even when an ordinary growth apparatus is used.

According to the present invention, similar effects are obtained between n-type layers, p-type layers, and an n-type layer and p-type layer. Furthermore, similar effects are obtained even in growth of another III-V group compound semiconductor crystal such as AlGaInP.

In the above-mentioned embodiments, the case where a III-V group semiconductor crystal is grown on a GaAs substrate has been describe. The present invention is not limited thereto. The present invention is also applicable to the case where a III-V group compound semiconductor crystal is grown on a crystal substrate made of a semiconductor at least containing a V-group compound or on a substrate having a semiconductor crystal layer at least containing a V-group compound on its surface.

As described above, according to the vapor deposition method of the present invention, at least an n-type dopant and a material compound containing V-group element are supplied to a crystal substrate prior to vapor deposition. Therefore, As can be prevented from being thermally lost from a crystal surface, and oxygen and moisture remaining in a vapor deposition chamber can be gettered. Thus, a good quality vapor-deposited film and interface thereof can be obtained.

Moreover, according to he present invention, the n-type dopant may be supplied during vapor deposition. In this case, oxygen and moisture contained in a material gas supplied for vapor deposition can also be gettered, and the n-type dopant reacts with a trace amount of oxygen remaining in the vapor deposition chamber which has not reacted with a material gas (organic metal compound) supplied into the vapor deposition chamber to be evacuated outside the vapor deposition apparatus. Thus, a good quality vapor-deposited film and interface thereof can be obtained. As result, the characteristics of semiconductor device such as a semiconductor laser and an LED can be enhanced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of forming a III-V group compound semiconductor crystalline layer on a semiconductor crystal containing at least V-group compound, comprising the steps of:

(a) supplying an n-type dopant and a material compound containing a V-group element onto the semiconductor crystal without causing the crystal growth of the III-V compound semiconductor crystalline layer, and (b) performing crystal growth of the III-V compound semiconductor crystalline layer.

2. A method according to claim 1, wherein in step (a) the n-type dopant and the material compound containing the V-group element are supplied during as a temperature of the semiconductor crystal is being adjusted.

3. A method according to claim 1, wherein in step (a) the n-type dopant and the material compound containing the V-group element are supplied during a period from when the heating of the semiconductor crystal starts to the start of crystal growth of the III-V group compound semiconductor crystalline layer.

4. A method according to claim 1, wherein during step (a) the n-type dopant and the material compound containing the V-group element are supplied during a period in which the crystal growth of the III-V group compound semiconductor crystalline layer is suspended, and between periods during which crystal growth occurs.

5. A method according to claim 1, wherein during step (a) the n-type dopant and the material compound containing the V-group element are supplied during at least two of three periods including a first period in which a temperature of the semiconductor crystal is being adjusted; a second period from a start of heating of the semiconductor crystal to a start of crystal growth of the III-V group compound semiconductor crystalline layer; and a third period in which the crystal growth of the III-V group compound semiconductor crystalline layer is suspended.

6. A method according to claim 1, wherein the step (b) includes the step of supplying another material compound containing III-group element together with the n-type dopant and the material compound containing the V-group element.

7. A method according to claim 1, wherein silane is used as the n-type dopant in step (a).

8. A method according to claim 1, wherein disilane is used as the n-type dopant during step (a).

* * * * *